United States Patent
Okabe et al.

(10) Patent No.: US 7,978,319 B2
(45) Date of Patent: Jul. 12, 2011

(54) OPTICAL SWITCHING METHOD AND OPTICAL SWITCH

(75) Inventors: Ryou Okabe, Kawasaki (JP); Shigeki Watanabe, Kawasaki (JP); Fumio Futami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 658 days.

(21) Appl. No.: 12/002,762

(22) Filed: Dec. 19, 2007

(65) Prior Publication Data
US 2008/0151244 A1   Jun. 26, 2008

(30) Foreign Application Priority Data
Dec. 25, 2006   (JP) .................. 2006-348381

(51) Int. Cl.
  *G01N 21/00*   (2006.01)
  *G01J 4/00*    (2006.01)
  *H04B 10/00*   (2006.01)
(52) U.S. Cl. .................. 356/73.1; 356/364; 398/152
(58) Field of Classification Search .......... 356/364–370, 356/73.1; 398/97, 37, 177, 152; 385/11, 385/37, 122; 359/300, 326, 238
See application file for complete search history.

(56) References Cited

U.S. PATENT DOCUMENTS

| | | | |
|---|---|---|---|
| 5,627,924 A | | 5/1997 | Jin et al. |
| 5,798,853 A | * | 8/1998 | Watanabe ............ 398/150 |
| 7,428,349 B2 | * | 9/2008 | Hainberger et al. ...... 385/11 |
| 7,518,711 B2 | * | 4/2009 | Futami et al. ............ 356/73.1 |
| 7,639,945 B2 | * | 12/2009 | Tamura et al. .......... 398/45 |
| 7,773,886 B2 | * | 8/2010 | Hainberger et al. ...... 398/97 |
| 7,853,145 B2 | * | 12/2010 | Futami et al. ............ 398/25 |
| 2006/0051100 A1 | | 3/2006 | Watanabe |
| 2006/0159463 A1 | * | 7/2006 | Futami et al. ............ 398/152 |
| 2006/0204170 A1 | * | 9/2006 | Igarashi et al. .......... 385/24 |

FOREIGN PATENT DOCUMENTS

| | | |
|---|---|---|
| EP | 1 633 066 A2 | 3/2006 |
| JP | 9-197446 | 7/1997 |
| JP | 2006-18485 | 1/2006 |
| JP | 2006-184851 | 7/2006 |

OTHER PUBLICATIONS

European Search Report dated May 3, 2010 and issued in corresponding European Patent Application 07023748.2.

* cited by examiner

*Primary Examiner* — Sang Nguyen
(74) *Attorney, Agent, or Firm* — Staas & Halsey LLP

(57) ABSTRACT

In a method and an optical switch by which a signal light is accurately switched even if a polarization state of a signal light inputted has a fluctuation, power of an output light of a polarizer which receives a signal light extracted from an output light of a nonlinear optical medium is monitored and a polarization state of an input signal light to the nonlinear optical medium is controlled so that the power becomes minimum (or maximum). The polarization state of the input signal light is monitored, a calculation of performing a predetermined conversion is executed to the polarization state of the input signal light, and a calculated polarization state is recorded (or recorded without conversion). A polarization state of a control light with respect to the input signal light is monitored and the polarization state of the control light is controlled so as to coincide with the polarization state of the input signal light recorded.

10 Claims, 11 Drawing Sheets

PRIOR ART

OPTICAL SWITCHING METHOD AND OPTICAL SWITCH

BACKGROUND OF THE INVENTION

1. Field of the Invention

The present invention relates to an optical switching method and an optical switch, and in particular to an optical switching method and an optical switch using a nonlinear optical effect which occurs in a nonlinear medium.

2. Description of the Related Art

With an optical fiber communication having recently increased in capacity, a bit rate of a transmission system has reached 40 Gb/s, and researches and developments for transmitting an optical signal of equal to or more than 160 Gb/s per wavelength have been carried out in research of a next-generation system. For researches and developments of such a transmission system, an optical waveform measuring device (sampling oscilloscope) which measures the waveform of a signal light becomes essential for monitoring/evaluating the quality of the signal light.

In order to measure the waveform of the signal light by the optical waveform measuring device, an optical switch for appropriately sampling the signal light is used. In the prior art optical waveform measuring device has measured the optical waveform by firstly performing an opto/electro conversion to the optical signal with an opto/electro converter and then electrically sampling the converted electric signal with an electronic circuit.

In such a prior art optical waveform measuring device, signal processing is performed all by an electric circuit after the stage the opto/electro conversion. Therefore, the performance thereof is restricted by an electric signal processing speed. For example, if the electric circuit has an electric signal processing speed (bandwidth) of 40 GHz to switch the signal light of equal to or more than 40 Gb/s, the signal light whose bandwidth exceeds 40 GHz can not be accurately switched.

Contrarily, there has been an optical signal processing technology for performing signal processing by controlling an optical signal by another optical signal with the nonlinear optical effect (parametric amplification) which occurs in the nonlinear medium (see e.g. the following patent document 1).

A response speed of the nonlinear optical effect is said to be on the order of femtosecond, and the signal processing speed of the optical switch applying the effect greatly exceeds the processing speed of the above-mentioned electric signal. If this optical switch is applied to the optical waveform measuring device, the optical waveform measuring device which can observe even a signal light of Tb/s can be realized.

FIG. 10 is a block diagram showing an arrangement of such a prior art optical switch. As shown in FIG. 10, a prior art optical switch 800 has a polarization adjuster 801a, a polarization adjuster 801b, an optical coupler 802, a highly-nonlinear fiber (nonlinear optical medium) 803, a polarizer 804, and an optical bandpass filter 805.

The polarization adjuster 801a adjusts a polarization direction of a signal light Os inputted to a polarization direction (polarization state) inclined by 90 degrees with respect to a passing axis of the polarizer 804. The polarization adjuster 801b adjusts a polarization direction of a control light $O_P$ (sampling pulse) inputted to a polarization direction inclined by approximately 45 degrees with respect to the passing axis of the polarizer 804. The optical coupler 802 couples or multiplexes the signal light $O_S$ with the control light $O_P$ whose polarization directions are respectively adjusted by the polarization adjusters 801a and 801b. The highly-nonlinear fiber 803 passes the signal light $O_S$ and the control light $O_P$ coupled by the optical coupler 802, thereby generating an intensity correlation signal (cross phase modulation signal) of the signal light $O_S$ and the control light $O_P$.

The polarization direction of the signal light $O_S$ is changed by the nonlinear optical effect in the highly-nonlinear fiber 803, and the signal light $O_S$ is outputted in the polarization direction approaching to the polarization direction of the control light $O_P$. The polarizer 804 has the passing axis of the signal light $O_S$ and the control light $O_P$ in a predetermined direction, and passes therethrough only polarization components in the polarization direction in parallel with the passing axis. The optical bandpass filter 805 passing therethrough only a wavelength $\lambda_s$ of the signal light $O_S$ passes and outputs only the polarization component of the signal light $O_S$ among the polarization components of the signal light $O_S$ and the control light $O_P$ having passed through the polarizer 804.

The above-mentioned operation will now be more specifically described referring to FIGS. 11A-11C. It is to be noted that the direction and the size of the arrow corresponding to the signal light $O_S$ shown in FIGS. 11A and 11B indicate the polarization direction and the amplitude of the signal light $O_S$. Also, the polarization direction of the signal light $O_S$ by the polarization adjuster 801a is, as shown in FIG. 11A, orthogonal to a polarization main axis direction "y" of the polarizer 804. Furthermore, FIG. 11C schematically shows a switching operation by the optical switch.

Firstly, during the period without the control light $O_P$, neither an optical parametric amplification nor a cross phase modulation occurs in the nonlinear optical fiber 803. Therefore, a polarization direction of a signal light $O_{S0}$ (see FIG. 11B) outputted from the nonlinear optical fiber 803 is the same as that of the input end thereof. Namely, the present polarization direction of the output signal light $O_{S0}$ is orthogonal to the polarization main axis direction "y" of the polarizer 804, so that the signal light $O_{S0}$ is completely interrupted by the polarizer 804.

On the other hand, with the control light $O_P$ being provided, the signal light $O_S$ is amplified with optical parametric amplification by the nonlinear optical fiber 803, and the polarization direction is changed by the cross phase modulation. However, the power of the control light $O_P$ is extremely large, so that the signal light $O_S$ becomes a signal light $O_{S1}$ (see FIG. 11B) amplified with the optical parametric amplification due to optical four-wave mixing. The efficiency of the optical parametric amplification becomes maximum when the polarization direction of the control light $O_P$ coincides with that of the signal light $O_S$ as shown in FIG. 11B.

Also, a signal light component newly generated by the optical four-wave mixing for the signal light $O_{S1}$ in the polarization state which coincides with that of the control light $O_P$ is not affected by the cross phase modulation, so that the polarization direction is not changed by the cross phase modulation. Accordingly, the polarization direction of the signal light amplified with the optical parametric amplification in the nonlinear optical fiber 803 is fixed in approximately the same direction as that of the control light $O_P$ as shown in FIG. 11B, and the polarization direction never rotates in excess of 90 degrees.

The angle between the polarization direction of the signal light $O_S$ at the input terminal of the nonlinear optical fiber 803 and the polarization direction of the control light $O_P$ is set at approximately 45 degrees. Also, the angle between the polarization direction of an output signal light $O_{S2}$ and the polarization main axis direction of the polarizer 804 is approximately 45 degrees. Accordingly, approximately 50 percent $(=(1/\sqrt{2})^2)$ of the power of the signal light outputted from the nonlinear optical fiber 803 passes through the polarizer 804.

In such an arrangement, a timing of inputting the control light $O_P$ into the highly-nonlinear fiber 803 is controlled, so that the switching of the signal light is performed. Also, when this optical switch 800 is applied to the light waveform measuring device, the opto/electro conversion is performed to the signal light outputted from the optical switch 800 by a photo detector, and the waveform of the electric signal converted is displayed, thereby measuring the waveform of the signal light.

[Patent document 1] Japanese patent application laid-open No. 2006-184851

However, in the above-mentioned prior art, it is premised for stably and accurately switching the signal lights that a signal light and a control light whose polarization states are respectively stable are inputted. Accordingly, there has been a problem that a signal light in a state where the polarization state fluctuates in propagation through an optical fiber or the like can not be accurately switched. Also, there has been another problem that the waveform of the signal light can not be accurately measured since the signal light can not be accurately switched.

On the other hand, it is conceived that the polarization state of the signal light whose polarization direction is adjusted by the polarization adjuster 801a is monitored, and the adjustment of the polarization direction of the signal light based on the monitored result is controlled in a feedback mode.

However, there is still a case where fluctuations of the polarization state of the signal light occurs within the optical switch 800 occur due to the fluctuation of the polarization state of the signal light inputted to the optical switch 800 and external environment changes such as changes of temperature and vibration, so that the polarization state of the signal light upon passing through the polarizer 804 can not be accurately monitored. In this case, there has been a further problem that the polarization direction of the signal light can not be appropriately adjusted, so that the signal light can not be accurately switched.

SUMMARY OF THE INVENTION

It is accordingly an object of the present invention to provide a method and an optical switch which accurately switch a signal light even when a polarization state of the signal light received fluctuates.

(1) In order to achieve the above-mentioned object, an optical switching method (or optical switch) according to the present invention comprises: a first step of (or first portion) monitoring power of an output light of a polarizer which receives a signal light extracted from an output light of a nonlinear optical medium and controlling a polarization state of an input signal light to the nonlinear optical medium so that the power becomes minimum; a second step of (or second portion) monitoring the polarization state of the input signal light, of executing a calculation of performing a predetermined conversion of the polarization state of the input signal light, and of recording a calculated polarization state; and a third step of (or third portion) monitoring a polarization state of a control light with respect to the input signal light and controlling the polarization state of the control light so as to coincide with the polarization state of the input signal light calculated.

Namely, in the present invention, when a signal light passing through a nonlinear optical medium and extracted from the output light of the medium is provided as an output signal light through a polarizer, power of the output light from the polarizer is monitored and the polarization state of the signal light inputted is controlled so that the power may become minimum.

In the absence of the control light at this time, the polarization state is controlled so that the signal light may be orthogonal to a transparent axis direction of the polarizer, whereby the output of the polarizer becomes minimum.

The polarization state of the input signal light is monitored at this time, and a calculation of performing a predetermined conversion to the polarization state is executed, so that the calculated polarization state is recorded.

When the control light is provided, the polarization state of the control light is controlled so as to be coincident with the polarization state of the input signal light calculated and recorded as mentioned above. Accordingly, even when the signal light fluctuates, the polarization state of the control light is controlled so as to follow the signal light, so that the control light is prevented from being affected by the fluctuation of the signal light.

The input signal light is provided to the nonlinear optical medium together with the control light, and the signal light is amplified with the parametric amplification by the control light, so that only the signal light component is extracted and outputted from the polarizer. This output signal light becomes the signal light switched and amplified by the control light from the polarizer.

(2) Also, in order to achieve the above-mentioned object, an optical switching method (or optical switch) according to the present invention comprises: a first step of (or first portion) monitoring power of an output light of a polarizer which receives a signal light extracted from an output light of a nonlinear optical medium and controlling a polarization state of an input signal light to the nonlinear optical medium so that the power becomes maximum; a second step of (or second portion) monitoring the polarization state of the input signal light to be recorded; and a third step of (or third portion) monitoring a polarization state of a control light with respect to the input signal light and controlling the polarization state of the control light so as to coincide with the polarization state of the input signal light recorded.

Namely, in the present invention, the polarization state of the input signal light in the above-mentioned (1) is controlled so that the power of the output light of the polarizer may become not minimum but maximum. Also, the polarization state of the input signal light at this time is recorded as it is without the calculation of a predetermined conversion. Accordingly, the polarization state of the control light is controlled so as to be coincident with the polarization state of the input signal light recorded.

Accordingly, the polarization state of the signal light at this time is controlled so that the output power of the polarizer may become maximum, namely, may be coincident with the transparent axis of the polarizer. Therefore, the signal light goes through the polarizer regardless of presence/absence of the control light.

Accordingly, the control light in this case is to be used mainly for parametric amplification rather than a switching operation with respect to the input signal light.

(3) Also, in order to achieve the above-mentioned object, an optical switching method (or optical switch) according to the present invention comprises: a first step of (or first portion) extracting a signal light component from an output light of a polarizer set on an output side of a nonlinear optical medium and controlling a polarization state of an input signal light to the nonlinear optical medium so that power of the signal light component becomes maximum; a second step of (or second portion) monitoring the polarization state of the input signal light to be recorded; a third step of (or third portion) monitoring a polarization state of a control light with respect to the input signal light and controlling the polarization state of the control light so as to coincide with the polarization state of the input signal light recorded; and a fourth step of (or fourth portion) extracting from the output light of the polarizer an idler light generated by optical four-wave mixing of the input signal light and the control light.

Namely this case, in the above-mentioned (2), does not extract the signal light from the output light of the nonlinear optical medium but provides the output light to the polarizer as it is. An input signal light component is extracted from the light outputted from the polarizer, and the polarization state of the input light to the nonlinear optical medium is controlled so that the power of the signal light component may become maximum.

The polarization state of the input signal light is preliminarily recorded, in which when the signal light is received, the polarization state of the control light is controlled in the same way as the above-mentioned (2) so that the polarization state of the signal light may be coincident with the polarization state of the input signal light recorded.

In this case, the input signal optical component, control light, and another wavelength component (idler light) generated by the optical four-wave mixing due to the component and the control light are outputted from the polarizer. However, the input signal light component is used only for controlling the polarization state of the input signal light, and is not outputted with the control light, so that only the idler light is extracted and outputted.

Accordingly, although the input signal light is outputted from the polarizer without a switching control of the control light in the same way as the above-mentioned (2), it is not outputted together with the control light. On the other hand, the idler light generated by the optical four-wave mixing by the input signal light and the control light is outputted as the signal light switched in the same way as the above-mentioned (1).

It is to be noted that the above-mentioned (1) and (2) may further comprise a fourth step of (or fourth portion) monitoring a polarization state of the signal light extracted from the output light of the nonlinear optical medium; and a fifth step of (or fifth portion) executing steps (portions) from the first step (or first portion) to the third step (or third portion) only when the polarization state of the signal light monitored at the fourth step (or fourth portion) has changed beyond a threshold.

Thus, when the fluctuation of the polarization state is small, the above-mentioned control can be saved.

Also, it is preferable that the monitoring of the polarization state of the input signal light at the above-mentioned second step (or second portion) and the monitoring of the polarization state of the control light at the third step (or third portion) are performed under the condition of the same close polarization state. Thus, the polarization state of the control light can accurately follow the polarization state of the input signal light.

Furthermore, the above-mentioned polarization state may represented by a Stokes parameter, and the above-mentioned predetermined conversion comprises e.g. a 45-degree rotation.

As mentioned above, according to the present invention, even when the polarization state of the signal light inputted fluctuates, the control light is controlled so as to follow the input signal light, thereby enabling the waveform of the signal light to be stably and accurately measured.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Embodiments of the optical switching method and the optical switch according to the present invention will now be described in detail by referring to the attached figures.

Arrangement [1]

FIG. 1

Figure 1:
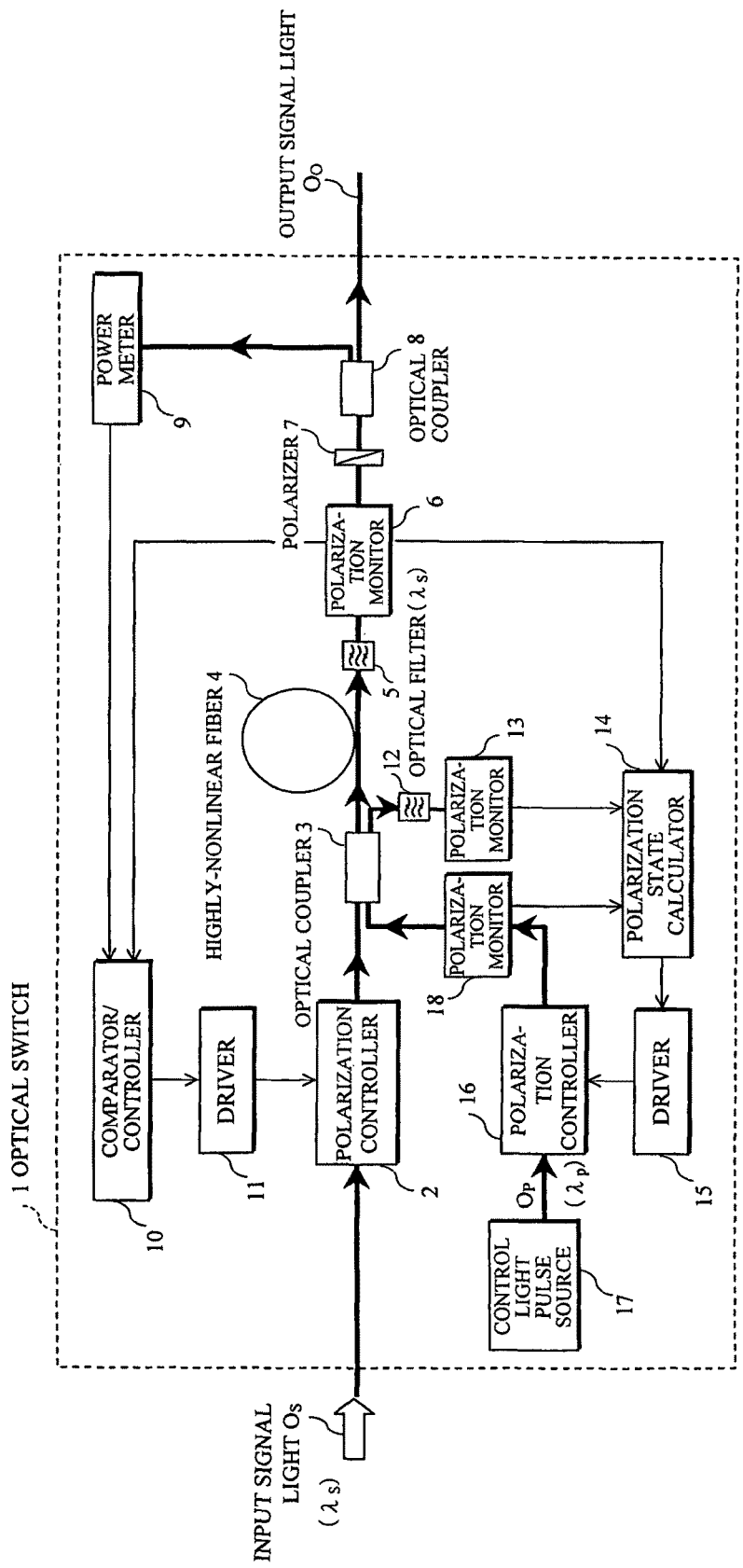
FIG. 1 is a block diagram showing an arrangement [1] of an optical switch which realizes an optical switching method according to the present invention.

FIG. 1 shows an arrangement [1] of the optical switch using the optical switching method according to the present invention. In an optical switch 1, an input signal light $O_S$ is provided as an output signal light $O_0$ through a series circuit composed of a polarization controller 2, an optical coupler 3, a highly-nonlinear fiber 4 which is a nonlinear optical medium, an optical filter 5, a polarization monitor 6, a polarizer 7, and an optical coupler 8. For the highly-nonlinear fiber which is the nonlinear medium, an optical fiber whose nonlinearity is enhanced such as a photonic crystal fiber, a bismuth-substituted fiber (optical fiber whose core is doped with bismuth), or a germanium-substituted fiber (optical fiber whose core is doped with germanium) is effective.

The optical coupler 8 decouples or demultiplexes the input signal light into an optical signal light component $O_0$ of the optical switch 1 and the output signal light component to a power meter 9. The power meter 9 controls the polarization state of the input signal light $O_S$ through a comparator/controller 10 and a driver 11 by the polarization controller 2, thereby forming a feedback control loop for the polarization state of the input signal light $O_S$. The optical power meter 9 is an optical detector converting an optical signal into an electric signal, and is composed of e.g. a photo detector (PD), a photomultiplier, and the like.

Also, the optical coupler 3 decouples the output light from the polarization controller 2 into the nonlinear fiber 4 and an optical filter 12. The optical filter 12 is connected to a polarization state calculator 14 through a polarization monitor 13. The polarization state calculator 14 is connected so as to control a polarization controller 16 through a driver 15. The polarization controller 16 receives the control light $O_P$ from a control light pulse source 17, and provides the light to the optical coupler 3 through a polarization monitor 18. The optical coupler 3 couples the input signal light and the control light. For the optical coupler 3, besides an ordinal fusion optical coupler, a multilayer film WDM coupler which can couple light waves of different wavelengths with low loss, and a Fiber Brag Grating (FBG) can be used. Also, the fusion optical coupler can be connected to the WDM coupler or the FBG in series to be used.

Furthermore, the polarization monitor 6 is connected so as to observe the polarization state of the output light from the optical filter 5 and to provide the polarization state to the comparator/controller 10 and the polarization state calculator 14. Also, the polarization state of the control light observed by the polarization monitor 18 is provided to the polarization state calculator 14. For the optical filters 5 and 12 besides the optical bandpass filter which can pass only the bandwidth of the signal light, a band rejection filter such as an FBG which can interrupt only the bandwidth of the control light and pass only the signal light, as well as a WDM coupler can be used. In this case, the optical filter is not required to be adjusted according to the wavelength of the signal light.

It is to be noted that if the distance between the polarization monitors 13 and 18 (optical fiber length) is made several tens of centimeters whereby neither bending of the optical fiber nor stress which may change the polarization state is applied, the same polarization state can be monitored in the polarization monitors 13 and 18.

Operation examples [1] and [2] of such an arrangement [1] will now be described.

Operation Example [1]

FIGS. 2-4B

Figure 2:
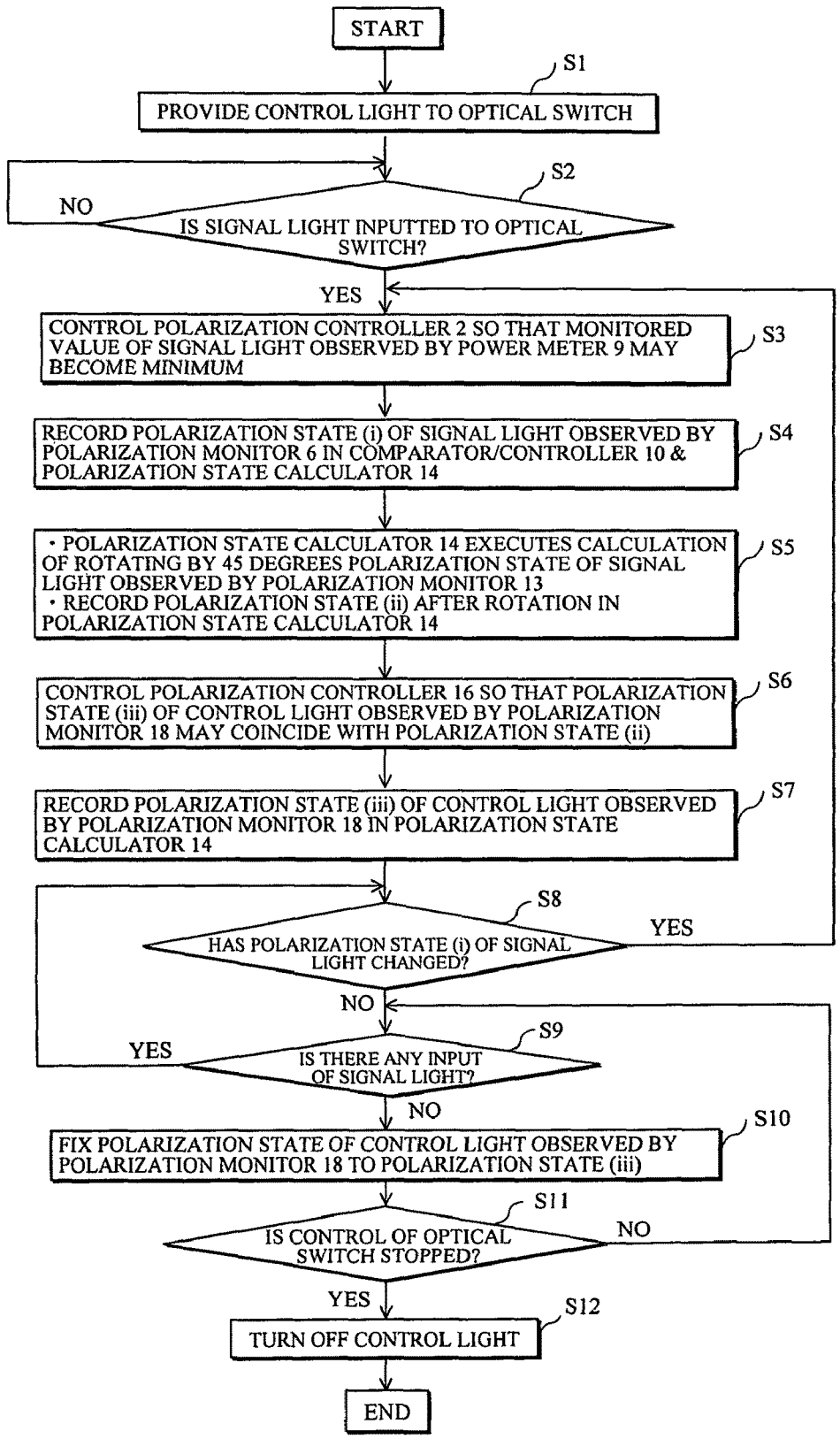
FIG. 2 is a flowchart showing an operation example [1] of the arrangement [1] shown in FIG. 1.

Firstly, the control light $O_P$ is provided to the optical switch 1 (at step S1 in FIG. 2). Namely, the control light $O_P$ generated by the control light pulse source 17 is provided to the optical coupler 3 through the polarization controller 16 and the polarization monitor 18.

Then, whether or not the signal light $O_S$ is inputted to the optical switch 1 is determined (at step S2) because the monitored value of the power meter 9 is preliminarily recorded in a recording medium such as an HDD within the comparator/controller 10 or a RAM, and a value at the time of no signal light input and a threshold are preset and compared with the monitored value. When the difference by the comparison is larger than the threshold, a control such as a control start is performed. A personal computer, an FPGA, a DSP, or the like is used for the comparator/controller 10, so that processing such as a comparison calculation can be performed.

When it is found at step S2 that the signal light $O_S$ is inputted, the polarization controller 2 is controlled so that the monitored value of the signal light observed by the power meter 9 from the optical coupler 8 may become minimum (at step S3).

Namely, the comparator/controller 10 records the monitored value (optical power) of the power meter 9, and drives the polarization controller 2 through the driver 11. The driver 11 is composed of a motor or the like which rotates a wavelength plate if the polarization controller 2 is a wavelength plate polarization controller. Alternatively, if the polarization controller 2 is of an optical fiber stress application type, the driver 11 corresponds to an applying portion which applies the stress by using a piezoelectric element or the like. Additionally, to the polarization controller, a polarization controller of an LN ($LiNbO_3$) modulator type, a liquid-crystal type, a variable Faraday rotator type where the wavelength plate is combined with a Faraday rotator, or the like can be applied. The comparator/controller 10 once rotates the wavelength plate, then monitors the value of the parameter 9, compares the value with the monitored value previously recorded, and performs a control of rotating the wavelength plate in the opposite direction if the power increases. When the difference by the comparison decreases, the control of further rotating forward direction is performed. The determination of the minimum value is performed by setting a threshold to a value of power to be compared and by stopping the control when the compared power difference is less than the threshold.

It is to be noted that while not shown in the attached figures, in the absence of the control light $O_P$, the polarization state of the input signal light $O_S$ is similarly controlled by the polarization controller 2 through the power meter 9, the comparator/controller 10, and the driver 11 so that the power of the output signal light $O_O$ may become minimum.

Figure 3A:
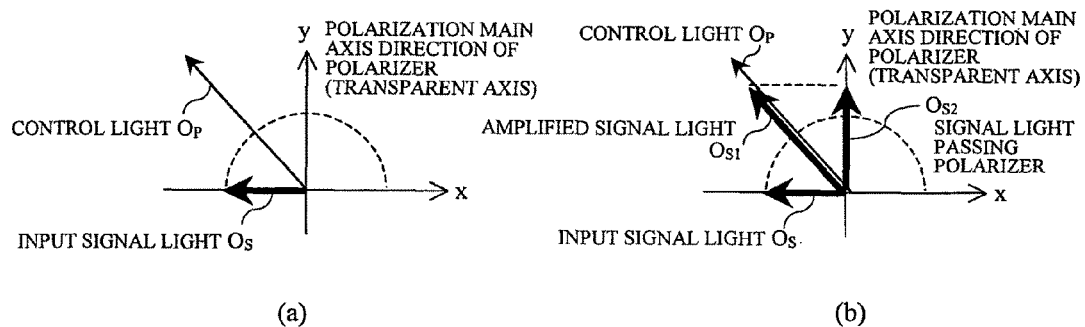
FIG. 3A is a diagram showing a polarization process ((a) polarization setting of signal light and control light upon input of optical switch, and (b) polarization state of signal light and control light upon output of optical switch) in the operation example [1] shown in FIG. 2.
Figure 11A:
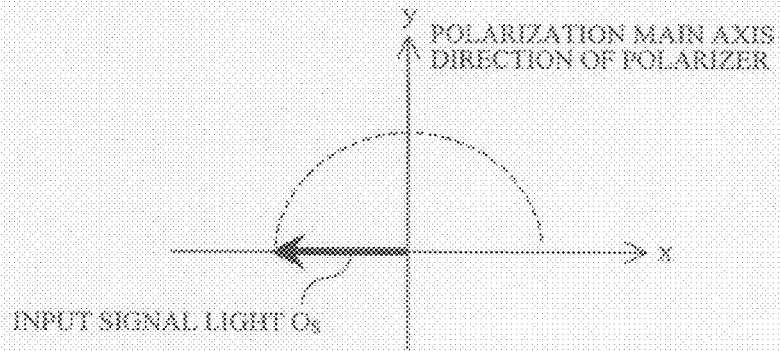
FIGS. 11A-11C are diagrams showing an operation principle of the general optical switch shown in FIG. 10.
Figure 11B:
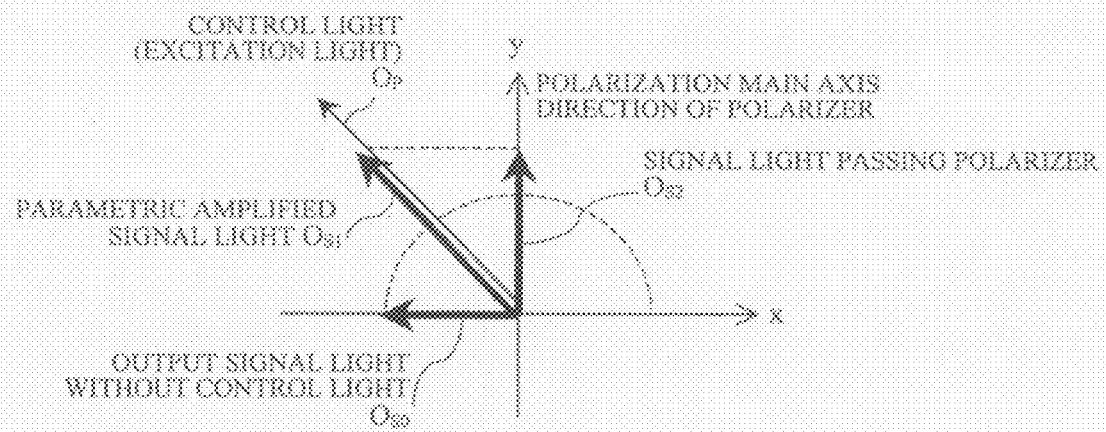
Figure 11C:
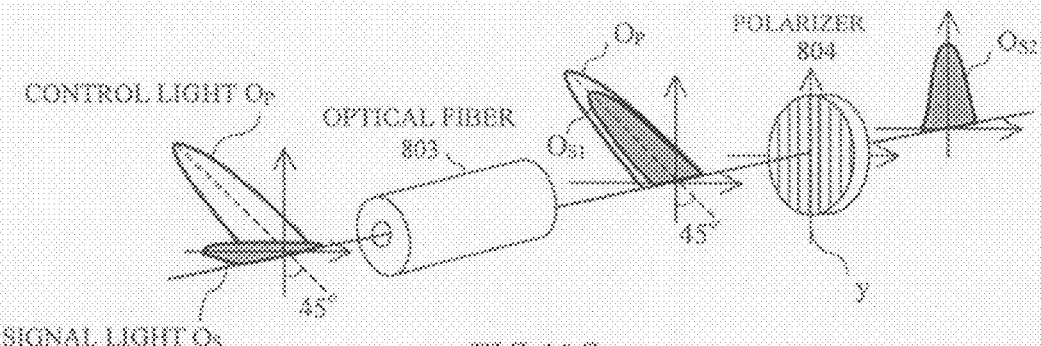

As a result, the polarization state of the input signal light $O_S$ is controlled in the vertical direction to the transparent axis of the polarizer 7 as shown in FIGS. 11A and 3A(a), which is the same as FIG. 11A, so that the output level of the output signal light $O_O$ outputted from the polarizer 7 becomes minimum.

A polarization state (i) of the signal light observed by the polarization monitor 6 at this time is recorded in a recording medium such as an HDD within the comparator/controller 10 and the polarization state calculator 14 or a RAM (at step S4).

The polarization state of the light observed by the polarization monitor 6 (and polarization monitors 13 and 18) will be described hereinbelow referring to FIGS. 4A and 4B.

Figure 4A:
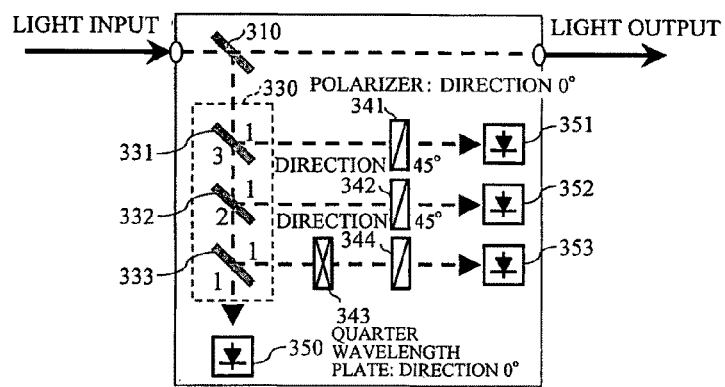
FIG. 4A is a diagram showing a general arrangement of a polarimeter as a polarization monitor used for each arrangement of this invention.

FIG. 4A shows an arrangement of a generally-known inline polarimeter used as the polarization monitor. As shown in FIG. 4A, this polarimeter has demultiplexers 310 and 330, polarizers 341 and 342, a ¼ wavelength plate 343, a polarizer 344, and 4 units of photo detectors (PD) 350-353.

The demultiplexer 310 demultiplexes or branches the signal light and the control light having passed through the nonlinear medium 4, outputs one of the branched lights, and outputs the other to the demultiplexer 330.

The demultiplexer 330 demultiplexes the light outputted from the demultiplexer 310 into 4 demultiplexed lights. Specifically, the demultiplexer 330 has optical couplers 331-333. The optical coupler 331 outputs ¼ of the light outputted from the demultiplexer 310 to the polarizer 341, and outputs ¾ of the light outputted from the demultiplexer 310 to the optical coupler 332.

The optical coupler 332 outputs ⅓ of the light outputted from the optical coupler 331 to the polarizer 342, and outputs ⅔ of the light outputted from the optical coupler 331 to the optical coupler 333. The optical coupler 333 outputs ½ of the light outputted from the optical coupler 332 to the ¼ wavelength plate 343, and outputs ½ of the light outputted from the optical coupler 332 to the PD 350.

The polarizer 341 passes only the polarization component in the polarization direction in parallel with the polarization direction "y" (see FIG. 3A) of the decoupled light outputted from the optical coupler 331. Also, the polarizer 341 may pass only the polarization component in the polarization direction inclined by 90 degrees with respect to the polarization direction "y" of the decoupled light outputted from the optical coupler 331. The PD 351 is a light receiving element which receives the decoupled light having passed through the polarizer 341 and converts the light into the electric signal.

The polarizer 342 passes only the polarization component in the polarization direction inclined by 45 degrees with respect to the polarization direction "y" of the decoupled light outputted from the optical coupler 332. The PD 352 is a light receiving element which receives the decoupled light having passed through the polarizer 342 and converts the light into the electric signal.

The ¼ wavelength plate 343 generates a phase difference corresponding to ¼ wavelength between the orthogonal polarization components of the decoupled light outputted from the optical coupler 333, namely, between the components of the polarization direction "x" and the polarization direction "y". The polarizer 344 passes only the polarization component of the polarization direction inclined by 45 degrees with respect to the polarization direction "y" of the decoupled light outputted from the optical coupler 333. The PD 353 is a light receiving element which receives the decoupled light having passed through the polarizer 344 and converts the light into the electric signal. The PD 350 is a light receiving element which directly receives the decoupled light outputted from the optical coupler 333 and converts the light into the electric signal.

While not shown in the attached figures, Stokes parameters ($S_0$, $S_1$, $S_2$, $S_3$) are calculated by using the following Equations (1)-(4) with the electric signals converted by the PDs being made intensity information of various polarization components of the above-mentioned signal light and control light, where $PD_0$-$PD_3$ indicate intensities of the respective electric signals received and converted by the PD 350-PD 353:

$$S_1 = 2PD_1 - PD_0 \qquad \text{Eq. (1)}$$

$$S_2 = 2PD_2 - PD_0 \qquad \text{Eq. (2)}$$

$$S_3 = 2PD_3 - PD_0 \qquad \text{Eq. (3)}$$

Figure 4B:
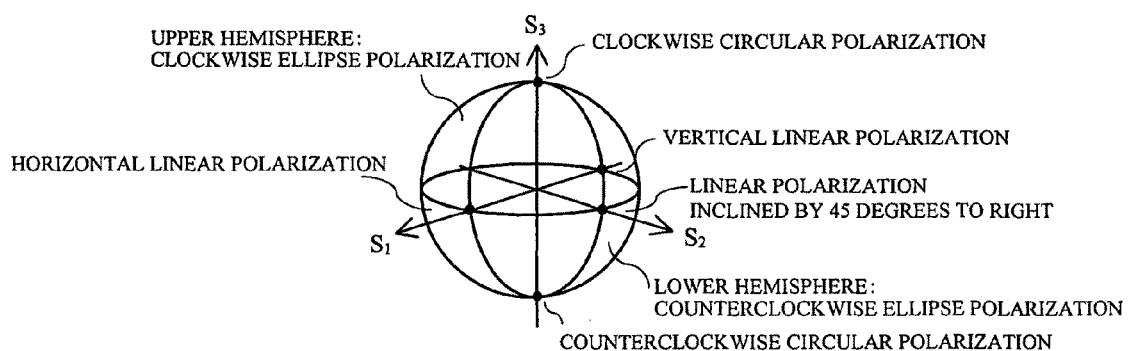
FIG. 4B is a diagram showing a display example of a Poincare sphere used for each arrangement of this invention.

FIG. 4B is a diagram showing a Poincare sphere indicating the Stokes parameters. The Stokes parameters ($S_0$, $S_1$, $S_2$, $S_3$) calculated as mentioned above are respectively indicated as one point on the Poincare sphere as shown in FIG. 4B. On the Poincare sphere, $S_0$ corresponds to a radius of the sphere and indicates intensity. $S_1$ indicates a horizontal and vertical polarization. $S_2$ indicates a polarization component of a diagonal direction. $S_3$ indicates a circular polarization. The values $S_0$-$S_3$ of the Stokes parameters have the relationship shown in the following equation:

$$S_0^2 = S_1^2 + S_2^2 + S_3^2 \qquad \text{Eq. (4)}$$

In case ($S_0$, $S_1$, $S_2$, $S_3$)=(1, 1, 0, 0), the monitored light is a horizontal linear polarization in parallel with the polarization direction "y". In case ($S_0$, $S_1$, $S_2$, $S_3$)=(1, -1, 0, 0), the monitored light is a linear polarization inclined by 90 degrees with respect to the polarization direction "y". Also, (1, 0, 1, 0) is a 45-degree linear polarization, and (1, 0, 0, 1) is a clockwise circular polarization.

The Stokes parameters thus obtained are provided to the comparator/controller 10 and the polarization state calculator 14 as the polarization state.

Back to the flowchart in FIG. 2, the input signal light $O_S$ coupled by the optical coupler 3 is taken out by the optical bandpass filter 12 after step S4, and the signal light is further transmitted to the polarization monitor 13. The polarization monitor 13 records the polarization state (Stokes parameter) of the signal light observed in a recording medium such as an HDD within the polarization state calculator 14 or a RAM. Responsively, the polarization state calculator 14 executes a predetermined conversion, e.g. a calculation of 45-degree rotation with respect to the polarization state of the signal light provided from the polarization monitor 13, and records a polarization state (ii) after having been rotated in this way (at step S5). The calculation processing at the polarization state calculator 14 at this time can be executed by a personal computer, an FPGA, a DSP, or the like. While these calculations are performed by using the Stokes parameter, they can be similarly performed by using the Jones vector. The Stokes parameter and the Jones vector are associated with each other by an operator called Pauli spin matrices in a one-on-one manner.

It is to be noted that while the angle between the polarization direction of the signal light and the polarization direction of the control light pulse is assumed to be approximately 45 degrees, adjustments with another angle which is most efficient can be appropriately performed according to the various setting conditions. However, the above-mentioned angle resides preferably between approximately 40 degrees to approximately 50 degrees at the input end of the nonlinear optical fiber by experiments and simulations. If this angle is too large, the optical parametric amplification by the optical four-wave mixing and the polarization change of the signal light by the cross phase modulation become hard to occur, that is not preferable. If this angle is too small, a loss at the polarizer becomes large, that is not preferable.

On the other hand, the polarization state calculator 14 receives the polarization state (Stokes parameter) of the control light $O_P$ coupled with the input signal light $O_S$ by the optical coupler 3 as a polarization state (iii) from the polarization monitor 18, and controls the polarization controller 16 through the driver 15 so that the polarization state (iii) of the control light may coincide with the polarization state (ii) of the signal light (at step S6).

It is to be noted that the operation for setting a predetermined polarization state can be realized by a product available in the market (corporate name: General Photonics Co., product name: PSY-101, URL: http://www.generalphotonics.com/) etc.

By this step S6, as shown in FIG. 3A(*b*), the input signal light $O_S$ is controlled so that the polarization state of the input signal light $O_S$ may coincide with that of the control $O_P$, so that the input signal light $O_S$ becomes a signal light $O_{S1}$ amplified with the parametric amplification.

Figure 3B:
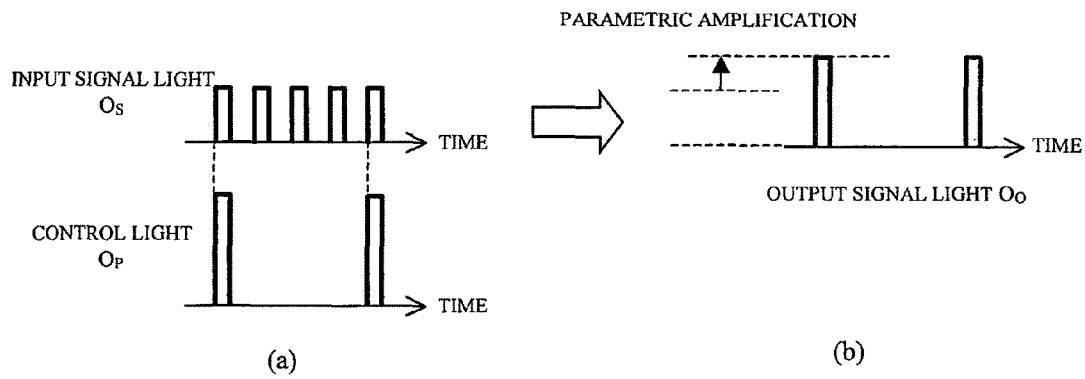
FIG. 3B is a diagram showing a pulse waveform (example of performing optical switching to 1 bit within 4 bits of signal light) ((a) signal light and control light upon input of optical switch, and (b) signal light upon output of optical switch) in the operation example [1] shown in FIG. 2.

Accordingly, when the cycle of repeating the control light $O_P$ shown in FIG. 3B(*a*) is longer than the cycle of repeating the data of the signal light, only the signal light $O_S$ synchronized with the control light $O_P$ is amplified with the parametric amplification. On the other hand, although the asynchronous signal light $O_S$ is outputted as it is from the fiber 4, it is interrupted by the polarizer 7. Namely, a switching operation of extracting a data string is performed synchronized with the cycle of repeating the control light from a repeated data string of the signal light. As for an output wavelength of the optical switch, only a wavelength $\lambda_s$ component of the signal light $O_S$ is passed through by the existence of the optical filter 5, so that the input signal light $O_S$ synchronized with the control light $O_P$ becomes, as shown in FIG. 3B(*b*), the output signal $O_0$ of the component $O_{S2}$ (see FIG. 3A(*b*)).

Figure 3C:
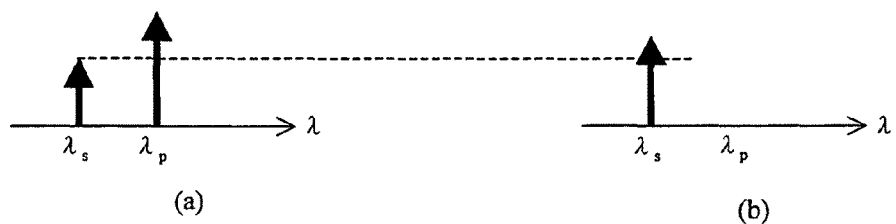
FIG. 3C is a diagram showing an input/output wavelength of an optical switch ((a) wavelength setting example of signal light and control light upon input of optical switch, and (b) wavelength of signal light upon output of optical switch) in the operation example [1] shown in FIG. 2.

Thus, as for the input/output wavelength of the optical switch 1, it is found from the wavelength $\lambda_s$ of the signal light and a wavelength $\lambda_p$ of the control light $O_P$ that as shown in FIG. 3C(*a*), only the wavelength $\lambda_s$ of the signal light $O_S$ shown in FIG. 3C(*b*) is included in the output signal light $O_P$.

At this time, the polarization state (iii) of the control light observed by the polarization monitor 18 is stored in the polarization state calculator 14 (at step S7).

Thereafter, the comparator/controller 10 and the polarization state calculator 14 determine based on the polarization state (i) provided from the polarization monitor 6 whether or not the polarization state (i) of the signal light fluctuates beyond the threshold (at step S8). As a result, when the polarization state (i) exceeds the threshold, the above-mentioned steps S3-S7 are repeatedly executed, otherwise the process proceeds to next step S9.

At step S9, it is determined whether or not the signal light is inputted. In the presence of the signal light input, the process returns to step S8. When the polarization state (i) does not fluctuate and the signal light is not inputted, the polarization state of the control light observed by the polarization monitor 18 at step S10 is fixed to the polarization state (iii) recorded at the above-mentioned step S7. This is to prevent the polarization control of the control light from being uncontrolled in the absence of the input of the signal light.

Thereafter, it is determined whether or not the control of the optical switch 1 is continued (at step S11). When the control is stopped, the control light pulse source 17 of the control light is turned off (at step S12), so that the control ends.

Operation Example [2]

FIGS. 5-6C

Figure 5:
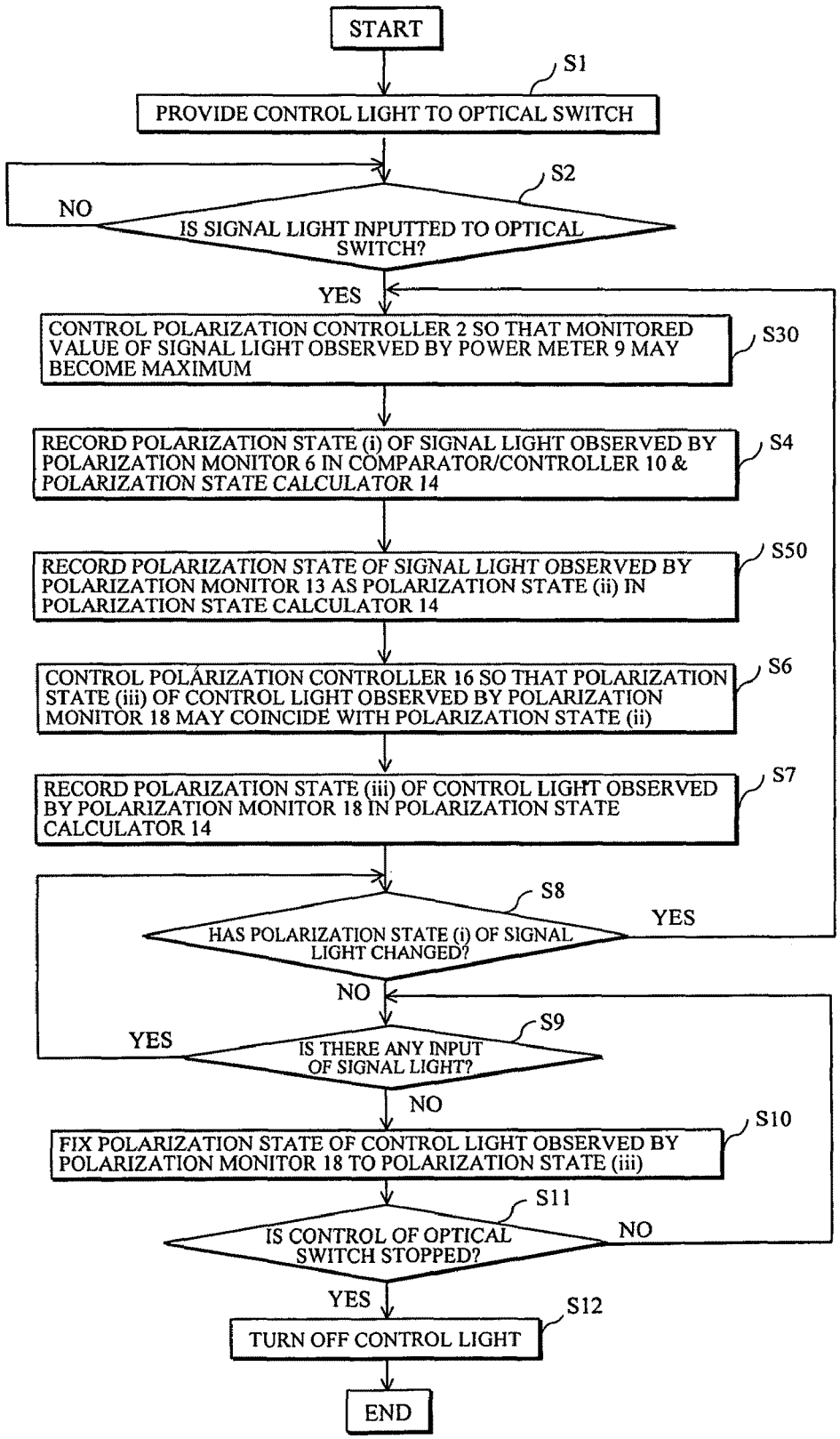
FIG. 5 is a flowchart showing an operation example [2] of the arrangement [1] shown in FIG. 1.

In the operation example [2], as will be recognized from the comparison between FIGS. 2 and 5, steps S30 and S50 in FIG. 5 are respectively substituted for steps S3 and S5 in FIG. 2. Accordingly, only the different points will now be described.

At step S30, the polarization controller 2 is controlled so that the observed value of the output signal light $O_0$ observed by the power meter 9 in the arrangement [1] shown in FIG. 1 may become maximum.

Figure 6A:
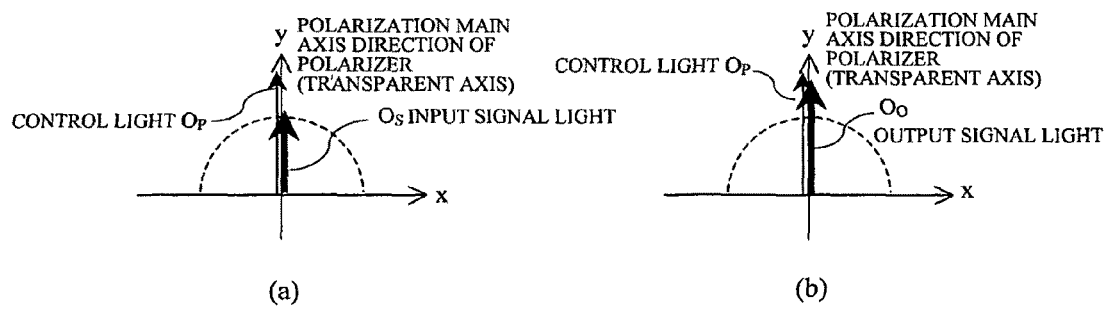
FIG. 6A is a diagram showing a polarization process ((a) polarization setting of signal light and control light upon input of optical switch, and (b) polarization state of signal light and control light upon output of optical switch) in the operation example [2] shown in FIG. 5.

Namely, as shown in FIG. 6A(*a*), the input signal light $O_S$ is controlled so as to assume the polarization state in the same direction as a transparent axis "y" of the polarizer 7, thereby enabling all of the input signal lights $O_S$ to be passed through the polarizer 7.

At step S50, the polarization state calculator 14 records the polarization state of the signal light observed by the polarization monitor 13 as it is without conversions, as the polarization state (ii).

Therefore, when the polarization controller 16 is controlled at step S6 so that the polarization state (iii) of the control light observed by the polarization monitor 18 may coincide with the polarization state (ii), the polarization state of the control light $O_P$ coincides with the polarization state of the input signal light $O_S$ as shown in FIG. 6A(*a*).

Figure 6B:
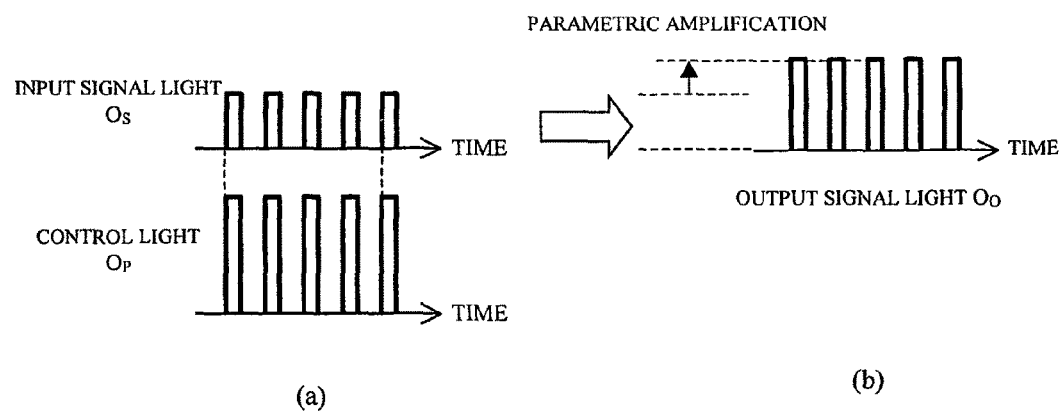
FIG. 6B is a diagram showing a pulse waveform (example of amplifying 4-bit signal light with parametric amplification) ((a) signal light and control light upon input of optical switch, and (b) signal light upon output of optical switch) in the operation example [2] shown in FIG. 5.

Accordingly, even if the control light $O_P$ with respect to the input signal light $O_S$ assumes a toothless or intermittent state as shown in FIG. 3B(*a*) (state where the cycle of repeating the control light is longer than that of repeating the signal light data), the input signal light $O_S$ passes through the polarizer 7 as it is. Therefore, the highly-nonlinear fiber 4 having received the input signal light and the control light through the optical coupler 3 is provided with the control light $O_P$ synchronized with the input signal light $O_S$ as shown in FIG. 6B(*a*) to obtain the output signal light $O_0$ amplified with the parametric amplification as shown in FIG. 6B(*b*). This state becomes the polarization state shown in FIG. 6A(*b*). In this case, the control light $O_P$ can not pass through the optical filter 5, so that the output signal light $O_0$ assumes only the component of the input signal light $O_S$ amplified with the parametric amplification.

Figure 6C:
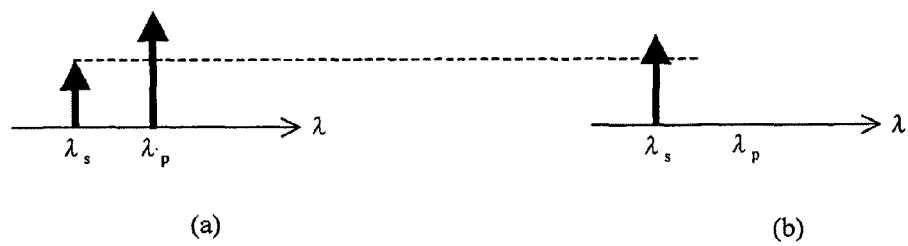
FIG. 6C is a diagram showing an input/output wavelength of an optical switch ((a) wavelength setting example of signal light and control light upon input of optical switch, and (b) wavelength of signal light upon output of optical switch) in the operation example [2] shown in FIG. 5.
Figure 7:
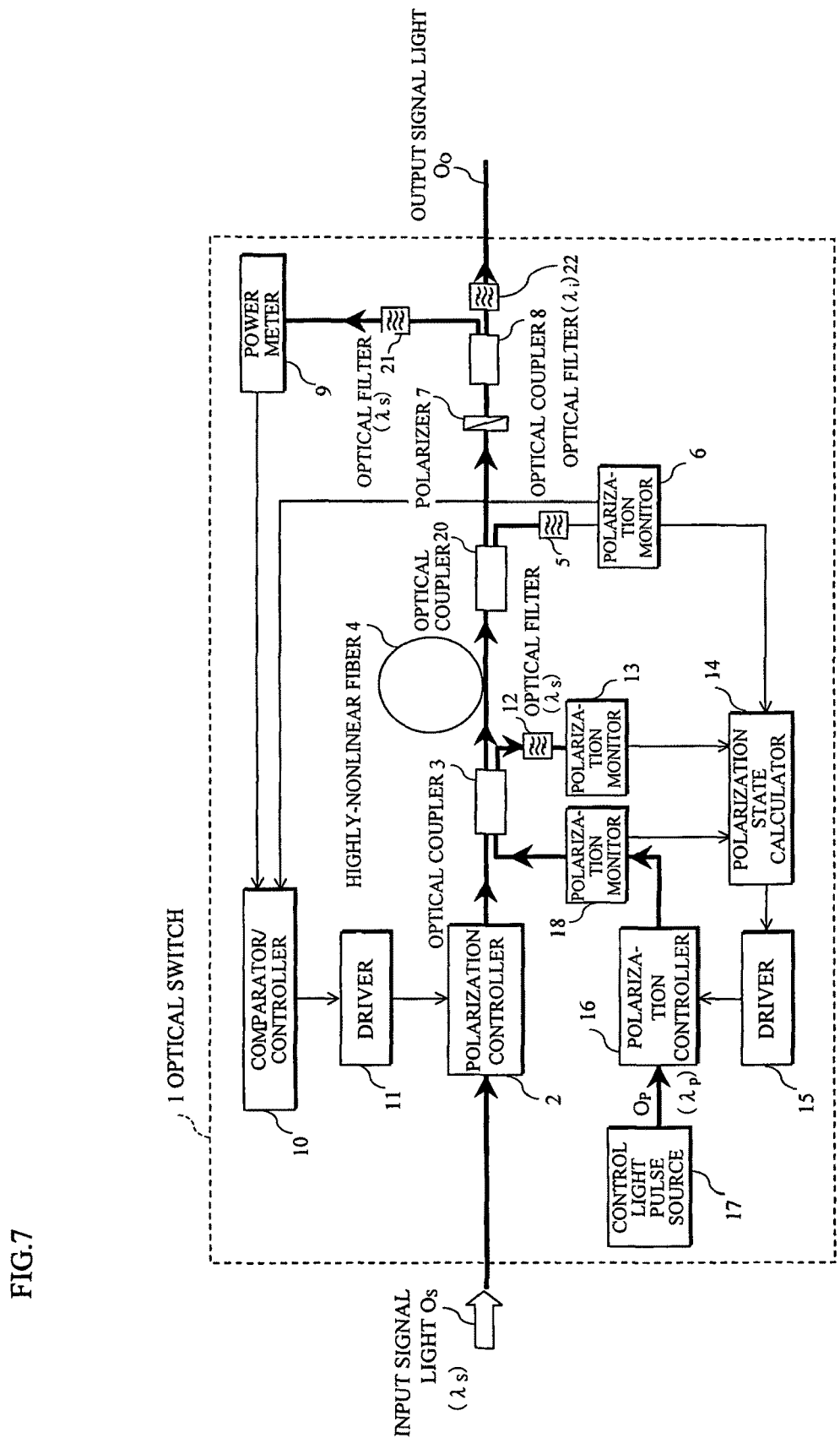
FIG. 7 is a block diagram showing an arrangement [2] of an optical switch which realizes an optical switching method according to the present invention.

Accordingly, the relationship between the input wavelength and the output wavelength in the optical switch 1, as shown in FIGS. 6C(*a*) and 6C(*b*), is that only the wavelength $\lambda_s$ of the input signal light $O_S$ is included in the output signal light $O_0$ in the same way as FIGS. 3C(*a*) and 3C(*b*).

Arrangement [2]

FIG. 7

In this arrangement [2], different from the arrangement [1] shown in FIG. 1, an optical coupler 20 is provided between the highly-nonlinear fiber 4 and the optical filter 5. One of the lights decoupled by the optical coupler 20 is provided to the optical filter 5, and the other is provided to the polarizer 7. Furthermore, different from the arrangement [1] an optical bandpass filter 21 for passing the signal light of the wavelength $\lambda_s$ is provided in the path from the optical coupler 8 to the power meter 9 placed on the output side of the polarizer 7, and an optical bandpass filter 22 for extracting only a wavelength $\lambda_i$ of the optical four-wave mixing (idler light) is provided for the output signal light $O_O$ outputted from the optical coupler 8.

While the control operation of the arrangement [2] is the same as the operation example [2] of the arrangement [1] shown in FIG. 5, the output signal light by the control operation is different. This will be described referring to FIGS. 8A-8C.

As for the input light to the polarizer 7, the output light of the highly-nonlinear fiber 4 is received as it is from the optical coupler 20 not through the optical filter. After passing through the polarizer 7, the signal light is decoupled by the optical coupler 8, then only the component of wavelength $\lambda_s$ of the signal light is extracted by the optical filter 21 to be provided to the power meter 9. For the optical filter 21, in the same way as the optical filters 5 and 12, a band rejection filter such as an FBG which can interrupt only the bandwidth of the control light and pass only the signal light, and a WDM coupler can be used, besides the optical bandpass filter which can pass the bandwidth of the signal light.

Figure 8A:
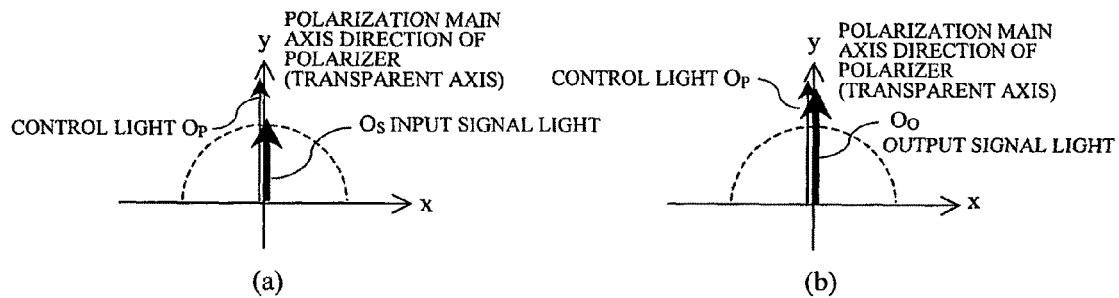
FIG. 8A is a diagram showing a polarization process ((a) polarization setting of signal light and control light upon input of optical switch, and (b) polarization state of signal light and control light upon output of optical switch) in the arrangement [2] shown in FIG. 7.

Accordingly, the polarization controller 2 is controlled through the comparator/controller 10 and the driver 11 so that the power of the output signal light of the polarizer 7 detected by the parameter 9 may become maximum, so that as shown in FIG. 8A(a), the direction of the input signal light $O_S$ becomes same as the transparent axis "y" of the polarizer 7.

The optical monitor 6 provides the polarization state of the signal light at this time to the comparator/controller 10 and the polarization state calculator 14 through the optical filter 5 from the optical coupler 20 in the same way as the above-mentioned operation examples.

Figure 8B:
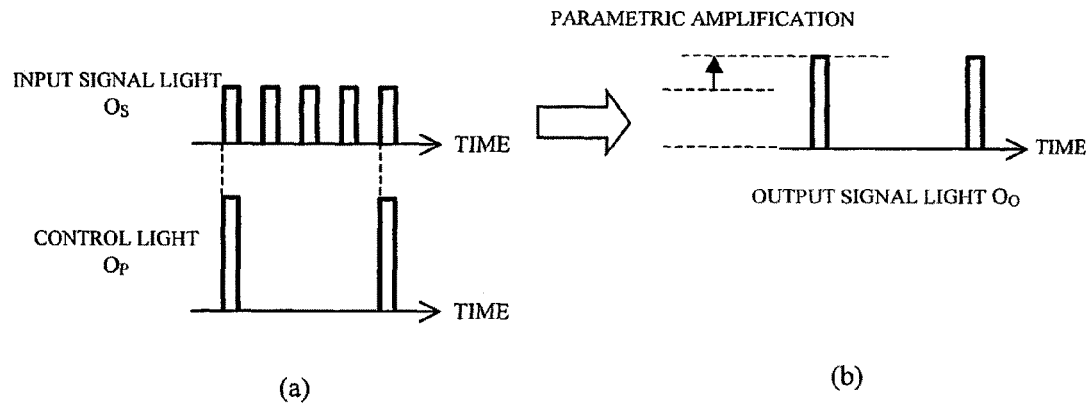
FIG. 8B is a diagram showing a pulse waveform (example of performing optical switching to 1 bit within 4 bits of signal light) ((a) signal light and control light upon input of optical switch, and (b) signal light upon output of optical switch) in the arrangement [2] shown in FIG. 7.
Figure 8C:
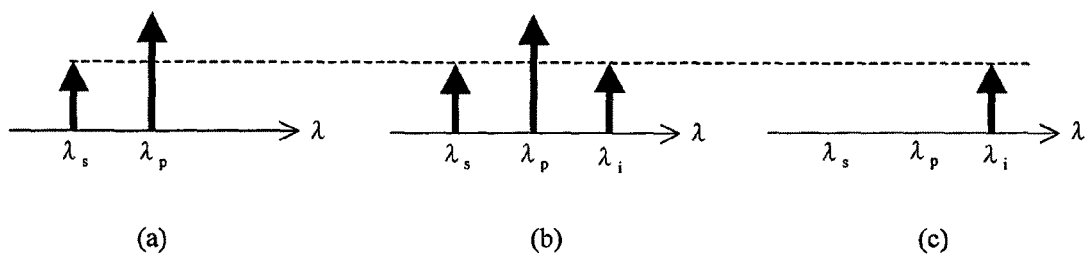
FIG. 8C is a diagram showing an input/output wavelength of an optical switch ((a) wavelength setting example of signal light and control light upon input of optical switch, (b) wavelength by optical 4-wave mixing, and (c) wavelength of signal light upon output of optical switch) in the arrangement [2] shown in FIG. 7.

In this state, as shown in FIG. 8B(a), when the control light $O_P$ is provided to the input signal light $O_S$ as a toothless or intermittent state (state where the cycle of repeating the control light is longer than that of repeating the data of the signal light) in the same way as FIG. 3B(a), the input signal light $O_S$ itself passes through all of the polarizer 7, the optical coupler 8, and the optical filter 21. However, due to the operation of the optical four-wave mixing by the control light $O_P$, as for the wavelength of the light inputted to the polarizer 7, a component (idler light) $\lambda_i$ of another wavelength by the optical four-wave mixing arises in addition to the wavelength $\lambda_s$ of the signal light and the wavelength $\lambda_P$ of the control light $O_P$, as shown in FIG. 8C(b).

Although this wavelength state is provided to the optical filter 22 through the polarizer 7 and the optical coupler 8, the optical filter 22 is a bandpass filter which passes only the wavelength $\lambda_i$ of the idler light obtained by the optical four-wave mixing. Therefore, as shown in FIG. 8C(c), the wavelength $\lambda_i$ by the four-wave mixing is outputted as the output signal light $O_O$. The polarization state at this time is the state shown in FIG. 8A(b), and its pulse waveform is shown in FIG. 8B(b). For the optical filter 22, besides the optical bandpass filter which can pass only the bandwidth of the idler light, a band rejection filter such as an FBG which can interrupt only the bandwidth of the signal light and the control light and pass only the idler light, as well as a WDM coupler can be used.

Thus, the idler light component which arises by the optical four-wave mixing generates only the timing where a signal light pulse and a control light pulse are temporally overlapped, in the same way as the operation example [1] of the arrangement [1].

Application Example

FIG. 9

Figure 9:
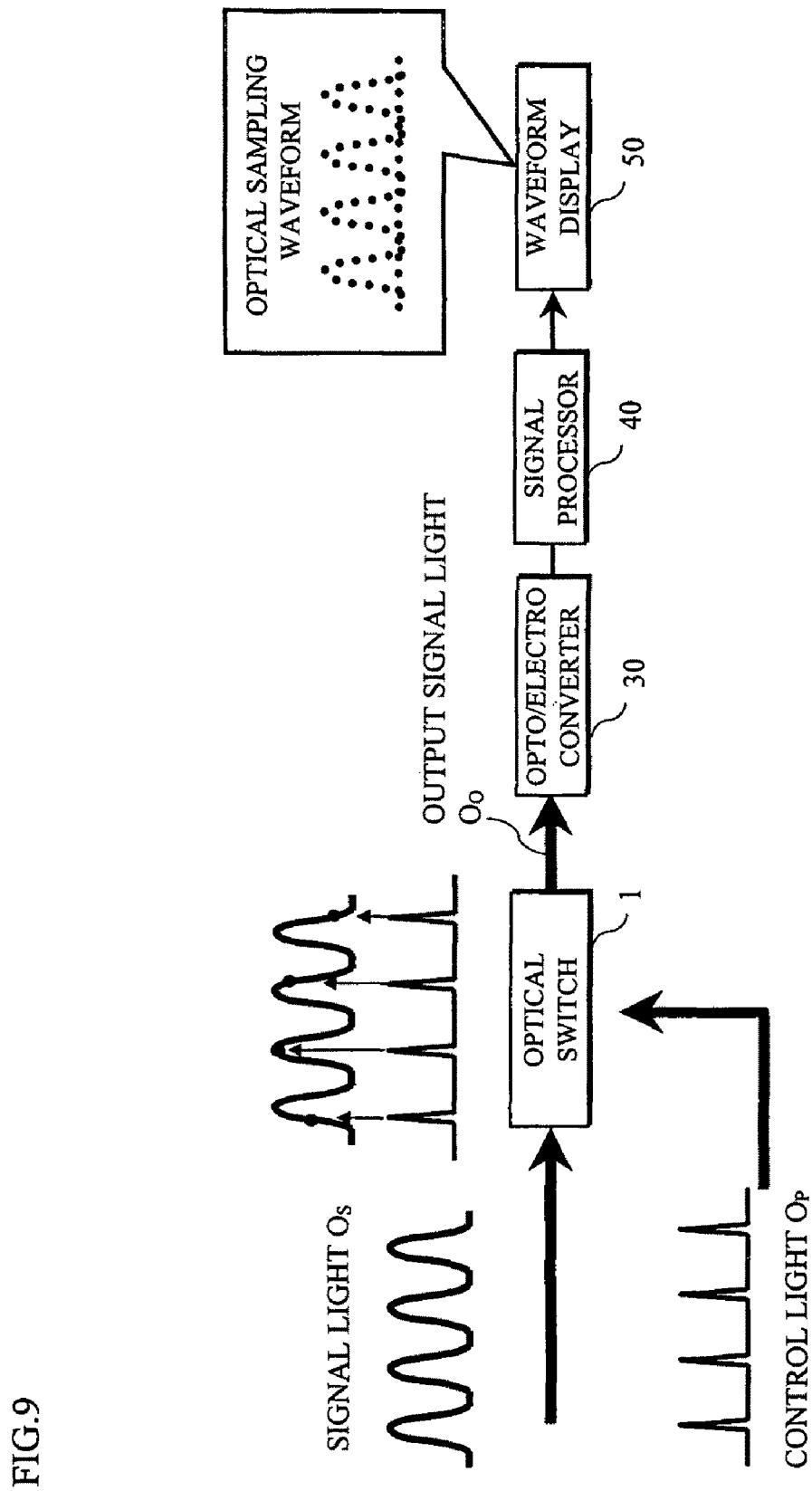
FIG. 9 is a block diagram showing an application example of an optical switch according to the present invention.
Figure 10:
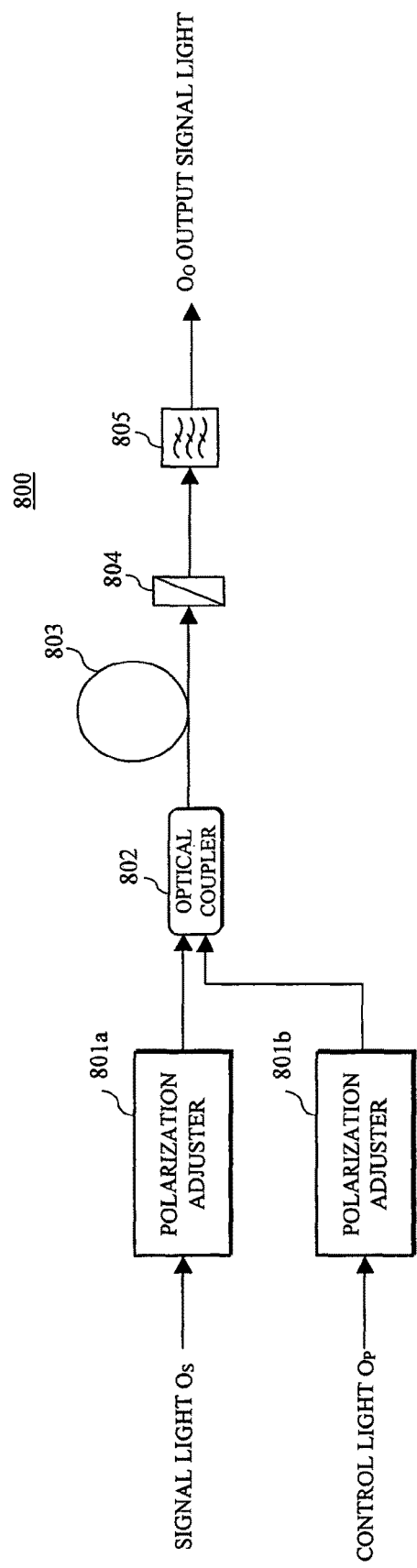
FIG. 10 is a block diagram showing an optical switch which has been generally known.

FIG. 9 shows an application example where the above-mentioned optical switch is applied to the optical sampling device. The optical switch 1 having received the signal light $O_S$ and the control light $O_P$ outputs the output signal light $O_O$ as mentioned above to be converted into an electric signal by the opto/electro converter 30, and then the waveform after optical sampling is shown in the waveform display portion 50 through a signal processor 40, so that the measurement of the optical waveform is made possible.

It is to be noted that the present invention is not limited by the above-mentioned embodiments, and it is obvious that various modifications may be made by one skilled in the art based on the recitation of the claims.

What is claimed is:
1. An optical switching method, comprising:
 (a) monitoring power of an output pulse light of a polarizer which receives a signal pulse light extracted from an output pulse light of a nonlinear optical medium, which receives an input signal pulse light and a control pulse light, and controlling a polarization state of the input signal pulse light to the nonlinear optical medium so that the power becomes minimum;
 (b) monitoring the polarization state of the input signal pulse light, performing a predetermined conversion of the polarization state of the input signal pulse light, and recording a polarization state obtained by the predetermined conversion; and
 (c) monitoring a polarization state of the control pulse light with respect to the input signal pulse light and controlling the polarization state of the control pulse light so as to coincide with the polarization state of the recorded input signal pulse light.

2. The optical switching method as claimed in claim 1, further comprising monitoring a polarization state of the signal pulse light extracted from the output pulse light of the nonlinear optical medium; and
 when the polarization state of the signal pulse light monitored has changed beyond a threshold, executing steps (a) through (c).

3. The optical switching method as claimed in claim 1, wherein the monitoring of the polarization state of the input signal pulse light at step (b) and the monitoring of the polarization state of the control pulse light at step (c) are performed under a condition of a same polarization state.

4. The optical switching method as claimed in claim 1, wherein the polarization state is represented by a Stokes parameter.

5. The optical switching method as claimed in claim 1, wherein the predetermined conversion comprises a 45-degree rotation.

6. An optical switch, comprising:
 a first controller monitoring power of an output pulse light of a polarizer which receives a signal pulse light extracted from an output pulse light of a nonlinear optical medium, which receives an input signal pulse light and a control pulse light, and controlling a polarization state of the input signal pulse light to the nonlinear optical medium so that the power becomes minimum;
 a first monitor monitoring the polarization state of the input signal pulse light, performing a predetermined conversion of the polarization state of the input signal pulse light, and recording a polarization state obtained by the predetermined conversion; and
 a second controller monitoring a polarization state of the control pulse light with respect to the input signal pulse light and controlling the polarization state of the control pulse light so as to coincide with the polarization state of the recorded input signal pulse light.

7. The optical switch as claimed in claim 6, further comprising a second monitor monitoring a polarization state of the signal pulse light extracted from the output pulse light of the nonlinear optical medium; and
   when the polarization state of the signal light monitored by the second monitor has changed beyond a threshold, executing the first controller, the first monitor, and the second controller.

8. The optical switch as claimed in claim 6, wherein the monitoring of the polarization state of the input signal pulse light by the first monitor and the monitoring of the polarization state of the control pulse light by the second controller are performed under a condition of a same polarization state.

9. The optical switch as claimed in claim 6, wherein the polarization state is represented by a Stokes parameter.

10. The optical switch as claimed in claim 6, wherein the predetermined conversion comprises a 45-degree rotation.

* * * * *